United States Patent
Hagita

(10) Patent No.: US 10,050,077 B2
(45) Date of Patent: Aug. 14, 2018

(54) BACK SURFACE RADIATION TYPE IMAGE SENSOR, IMAGING DEVICE, AND ELECTRONIC APPARATUS

(71) Applicant: SONY CORPORATION, Tokyo (JP)

(72) Inventor: Tadahiro Hagita, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/904,795

(22) PCT Filed: Jul. 22, 2014

(86) PCT No.: PCT/JP2014/003838
§ 371 (c)(1),
(2) Date: Jan. 13, 2016

(87) PCT Pub. No.: WO2015/015753
PCT Pub. Date: Feb. 5, 2015

(65) Prior Publication Data
US 2016/0204147 A1    Jul. 14, 2016

(30) Foreign Application Priority Data

Jul. 29, 2013 (JP) .................................. 2013-156903

(51) Int. Cl.
*H01L 27/146* (2006.01)

(52) U.S. Cl.
CPC .... *H01L 27/1464* (2013.01); *H01L 27/14629* (2013.01); *H01L 27/14636* (2013.01); *H01L 27/14685* (2013.01)

(58) Field of Classification Search
None
See application file for complete search history.

(56) References Cited

U.S. PATENT DOCUMENTS 9,478,575 B2 * 10/2016 Kato ................. H01L 27/14621
2010/0148290 A1    6/2010 Park
(Continued)

FOREIGN PATENT DOCUMENTS

JP    2006 261372 A    9/2006
JP    2009-029000    2/2009
(Continued)

OTHER PUBLICATIONS

International Search Report prepared by the European Patent Office dated Oct. 6, 2014, for International Application No. PCT/JP2014/003838.

(Continued)

*Primary Examiner* — Hoang-Quan Ho
(74) *Attorney, Agent, or Firm* — Sheridan Ross P.C.

(57) ABSTRACT

A device including a substrate and an imaging element layer having a plurality of imaging elements is provided, where the imaging element layer is located between the substrate and a wiring layer having a plurality of wiring lines (41), and wiring lines of the wiring layer are arranged in pixel regions (Z) configured to receive light having a wavelength less than a predetermined wavelength (B, G). Accordingly, by more uniformly distributing the wiring layer throughout, it is possible to reduce an unevenness that occurs at a polishing film. Moreover, because wiring lines are not disposed in pixel regions (Z) configured to receive light having a wavelength greater than the predetermined wavelength (R), irregularities may be reduced.

16 Claims, 15 Drawing Sheets

(56) References Cited

U.S. PATENT DOCUMENTS

| | | | | |
|---|---|---|---|---|
| 2011/0140225 A1* | 6/2011 | Tsutsui | ............. | H01L 27/14623 |
| | | | | 257/440 |
| 2012/0273683 A1 | 11/2012 | Saito | | |
| 2014/0035086 A1* | 2/2014 | Kato | ................. | H01L 27/1464 |
| | | | | 257/432 |
| 2014/0145287 A1* | 5/2014 | Kato | ................ | H01L 27/14621 |
| | | | | 257/432 |

FOREIGN PATENT DOCUMENTS

| | | |
|---|---|---|
| JP | 2011-061092 | 3/2011 |
| JP | 2011-129627 | 6/2011 |
| JP | 2012-164870 | 8/2012 |
| JP | 2012-231032 | 11/2012 |
| WO | WO 2013/031707 A1 | 3/2013 |

OTHER PUBLICATIONS

Official Action (no English translation available) for Japanese Patent Application No. 2013-156903 dated Jan. 31, 2017, 12 pages.
Official Action (no English translation available) for Japanese Patent Application No. 2013-156903 dated May 11, 2017, 6 pages.
Official Action (with English translation) for Chinese Patent Application No. 201480036251.3, dated Mar. 5, 2018, 25 pages.

* cited by examiner

US 10,050,077 B2

BACK SURFACE RADIATION TYPE IMAGE SENSOR, IMAGING DEVICE, AND ELECTRONIC APPARATUS

CROSS REFERENCE TO RELATED APPLICATIONS

This application is a national stage application under 35 U.S.C. 371 and claims the benefit of PCT Application No. PCT/JP2014/003838 having an international filing date of Jul. 22, 2014, which designated the United States, which PCT application claimed the benefit of Japanese Patent Application No. 2013-156903 filed Jul. 29, 2013, the disclosures of which are incorporated herein by reference in their entirety.

TECHNICAL FIELD

The present technology relates to a back surface radiation type image sensor, an imaging device, and an electronic apparatus and particularly, to a back surface radiation type image sensor, an imaging device, and an electronic apparatus that can realize a high image quality while equalizing a wiring density of a wiring layer.

CROSS REFERENCE TO RELATED APPLICATIONS

This application claims the benefit of Japanese Priority Patent Application JP 2013-156903 filed on Jul. 29, 2013, the entire contents of which are incorporated herein by reference.

BACKGROUND ART

A general image sensor is called a surface radiation type image sensor and has a configuration in which, after an imaging element (photodiode) is formed on a substrate, a wiring layer is stacked, and a color filter and an on-chip lens are formed thereon. A general image sensor can be formed in this manner because the wiring layer may be formed after the imaging element is manufactured.

In a wiring layer formed on an upper layer of the imaging element, a hole is formed to enable light to be transmitted in a pixel unit so as not to disturb reception of the light in the pixel unit. For this reason, in the surface radiation type image sensor, the light is partially reflected or shielded by the wiring layer around the hole, the light may not be appropriately received, and a subject may not be imaged at an original brightness.

Therefore, a so-called back surface radiation type image sensor (or a back illuminated sensor) has been suggested; the back surface radiation type image sensor may have a structure in which, after the imaging element is manufactured, the wiring layer is stacked thereon, the substrate is reversed, the substrate of the back surface side is polished to a predetermined thickness, and light may be received from the back surface side. In the back surface radiation type image sensor, because the color filter and the on-chip lens are formed directly on the imaging element, the subject can be imaged at the original brightness without disturbing incidence of the light on the imaging element similar to the wiring layer in the surface radiation type image sensor.

Recently, imaging devices using the back surface radiation type image sensor have been utilized in a variety of applications; accordingly, various application technologies of the back surface radiation type image sensor have been developed (refer to Patent Literature 1).

CITATION LIST

Patent Literature

PTL 1: JP 2013-120813 A

SUMMARY OF INVENTION

Technical Problem

As described above, the back surface radiation type image sensor utilizes a structure in which the on-chip lens, the color filter, the imaging element, and the wiring layer are sequentially formed as viewed from an incidence direction of light and a support substrate is affixed to the wiring layer side becoming a back surface. For this reason, the back surface adhered to the support substrate is flattened by chemical mechanical polishing (CMP).

However, the back surface radiation type image sensor is extraordinarily thin. For this reason, if the wiring density of the uppermost layer of the wiring layer is not equalized, it is difficult to flatten the wiring layer even though the wiring layer is polished by the CMP. In particular, because originally necessary wiring lines are small in the uppermost layer in the wiring layer of a pixel region, the wiring density becomes small and the wiring density may not be equalized in only the originally necessary wiring lines. Therefore, in the uppermost layer of the wiring layer, wiring lines called so-called dummy wiring lines that are not electrically connected are provided in the pixel region. Thereby, the wiring density is equalized.

However, if the wiring density is defined by only a design, a portion of light, particularly, light having a longer wavelength transmits through an imaging element layer and is reflected by the dummy wiring lines; accordingly, this reflected light is received as reflection light by the imaging element layer again. As a result, for pixels in which the dummy wiring lines are arranged and which light of a color of a wavelength longer than a predetermined wavelength is transmitted, the imaging element receives each the incidence light and the reflection light of the wiring lines. For this reason, a signal having brightness more than the original brightness may be generated, the brightness may not be equalized, and stripe irregularities may occur along the dummy wiring lines.

The present technology has been made in view of the above-described circumstances and realizes a back surface radiation type image sensor that can decrease an influence of light transmitting through an imaging element layer and reflected by dummy wiring lines while equally maintaining wiring densities of a pixel region and the other region in an uppermost layer of a wiring layer.

Solution to Problem

A back surface radiation type image sensor according to a first aspect of the present technology is provided having the dummy wiring lines arranged in the pixel region in which light of a wavelength shorter than a predetermined wavelength is received; accordingly in the back surface radiation type image sensor, dummy wiring lines adjust a wiring density in an uppermost layer of a pixel region.

The dummy wiring lines are arranged in a pixel region in which light of a color of a wavelength shorter than the predetermined wavelength is received.

The dummy wiring lines are arranged in a pixel region in which blue light is received.

The dummy wiring lines are arranged in a pixel region in which green light is received.

The back surface radiation type image sensor includes a pixel region in which blue light, green light, and red light are received.

The back surface radiation type image sensor further includes a pixel region in which at least one of white light and infrared light is received.

The predetermined wavelength is any wavelength of 400 to 600 nm.

The dummy wiring lines are arranged in a pixel region in which light of a color with any wavelength of 400 to 600 nm as a peak and light of a color of a wavelength shorter than the wavelength of the color are received.

The predetermined wavelength is any wavelength of 530 to 550 nm.

The dummy wiring lines are arranged in a pixel region in which light of a color with any wavelength of 530 to 550 nm as a peak and light of a color of a wavelength shorter than the wavelength of the color are received.

The dummy wiring lines are arranged in a pixel region in which light of a color of a wavelength shorter than a wavelength of a color with any wavelength of 630 to 650 nm as a peak is received.

The dummy wiring lines have a pixel width or a width smaller than the pixel width.

An imaging device according to a second aspect of the present technology is provided where the dummy wiring lines are arranged in the pixel region in which light of a wavelength shorter than a predetermined wavelength is received in the imaging device including a back surface radiation type image sensor that has dummy wiring lines adjusting a wiring density in an uppermost layer of a pixel region.

An electronic apparatus according to a third aspect of the present technology is provided where the dummy wiring lines are arranged in the pixel region in which light of a wavelength shorter than a predetermined wavelength is received in the electronic apparatus including a back surface radiation type image sensor that has dummy wiring lines adjusting a wiring density in an uppermost layer of a pixel region.

In the first to third aspects of the present technology, in the back surface radiation type image sensor that has the dummy wiring lines adjusting the wiring density in the uppermost layer of the pixel region, the dummy wiring lines are arranged in a pixel region in which light of a wavelength shorter than the predetermined wavelength is received.

In one embodiment, a solid-state imaging device is provided, the solid-state imaging device including a substrate and an imaging element layer having a plurality of imaging elements, the imaging element layer located between the substrate and a wiring layer having a plurality of wiring lines, wherein wiring lines of the wiring layer are arranged in pixel regions configured to receive light having a wavelength less than a predetermined wavelength.

In yet another embodiment, an electronic apparatus is provided, the electronic apparatus including a solid-state imaging device that includes a substrate, and an imaging element layer having a plurality of imaging elements, the imaging element layer located between the substrate and a wiring layer having a plurality of wiring lines, wherein wiring lines of the wiring layer are arranged in pixel regions configured to receive light having a wavelength less than a predetermined wavelength.

In yet, another embodiment, a method of manufacturing a solid-state imaging device is provided, the method comprising: forming an imaging element layer between a substrate and a wiring layer; and forming one or more wiring lines at an upper layer of the wiring layer, wherein wiring lines of the wiring layer are arranged in pixel regions configured to receive light having a wavelength less than a predetermined wavelength and wiring lines of the wiring layer are not arranged in pixel regions configured to receive light having a wavelength greater than the predetermined wavelength.

Advantageous Effects of Invention

According to the first to third aspects of the present technology, particularly, an influence by reflection of wiring lines of a wiring layer is decreased while a wiring density in an uppermost layer of the wiring layer is equalized, so that a high image quality can be realized.

DESCRIPTION OF EMBODIMENTS

Hereinafter, modes to carry out the present technology (hereinafter, referred to as embodiments) will be described. The following description will be made in the order described below.

1. First embodiment (example of case of arranging wiring lines at B and G pixel positions of RGB pixels)

2. Second embodiment (example of case of arranging dummy wiring lines made of narrow wiring lines at B and G pixel positions of RGB pixels)

3. Third embodiment (example of case of arranging dummy wiring line at B pixel position of RGB pixels)

4. Fourth embodiment (example of case of arranging dummy wiring line at B pixel position of RGBW pixels)

5. Fifth embodiment (example of case of arranging dummy wiring lines at B and G pixel positions of RGB-IR pixels)

6. Sixth embodiment (example of case of arranging dummy wiring lines made of narrow wiring lines at B and G pixel positions of RGB-IR pixels)

7. Seventh embodiment (example of case of arranging dummy wiring line at B pixel position of RGB-IR pixels)

1. First Embodiment

<Lateral Cross-Section and Manufacturing Process of Back Surface Radiation Type Image Sensor>

Figure 1:
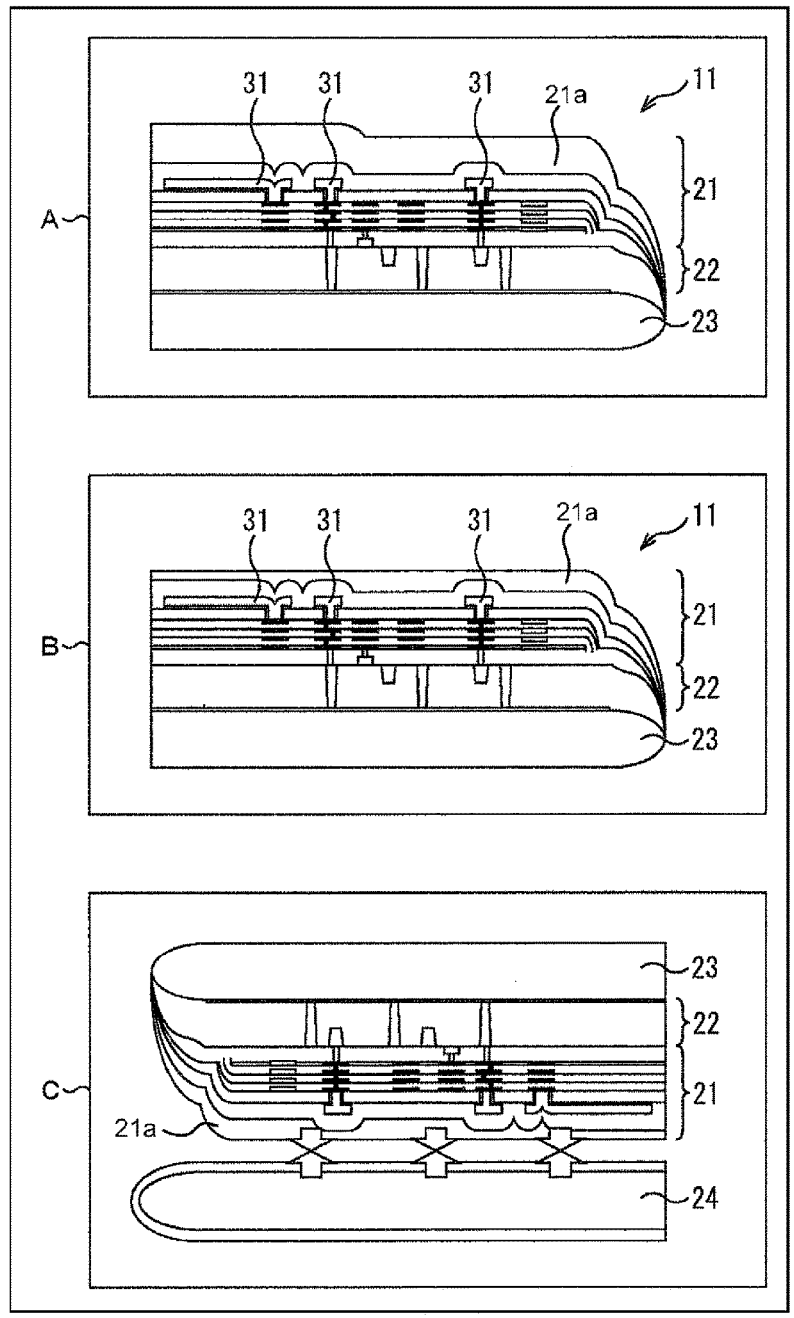
FIG. 1 is a diagram illustrating a lateral cross-section and a manufacturing process of a back surface radiation type image sensor to which the present technology is applied.

FIG. 1 illustrates a lateral cross-section and a manufacturing process of a back surface radiation type image sensor to which the present technology is directed.

As illustrated by a state A of FIG. 1, in a back surface radiation type image sensor 11, an imaging element layer (photodiode layer) 22 is provided on a substrate 23 and a wiring layer 21 is formed at an uppermost layer. On an upper portion of the wiring layer 21, a polishing film 21a is formed. In the wiring layer 21, wiring lines 31 are arranged.

As illustrated by a state B, the polishing film 21a is polished by chemical mechanical polishing (CMP) so that the polishing film 21a is flattened. That is, the polishing film 21a may be polished such that the upper surface of the polishing film 21a is generally flat.

In addition, as illustrated by a state C, the polishing film 21a is affixed to a support substrate 24, in a state in which the upper and lower sides of the back surface radiation type image sensor 11 in the drawings (such as in FIG. 1) are reversed. Then, although not illustrated in the drawings, an uppermost surface (a backmost surface in the states A and B) of the substrate 23 in the state C of FIG. 1 is polished such that the imaging element layer 22 can receive light from a back surface (uppermost surface in the state C).

<Equalization of Wiring Density of Uppermost Layer of Wiring Layer>

As described above with reference to FIG. 1, the back surface radiation type image sensor 11 is finished by affixing the polishing film 21a of the wiring layer 21 onto the support substrate 24. Here, because an unevenness exists in the polishing film 21a due to the differences in a wiring density of the uppermost wiring lines of the wiring layer 21, it is necessary to equalize the wiring density in the uppermost layer of the wiring layer 21. Stated another way, by more uniformly distributing the wiring layer 21 throughout the wiring layer 22, it is possible to reduce an unevenness that occurs at the polishing film 21a.

Figure 2:
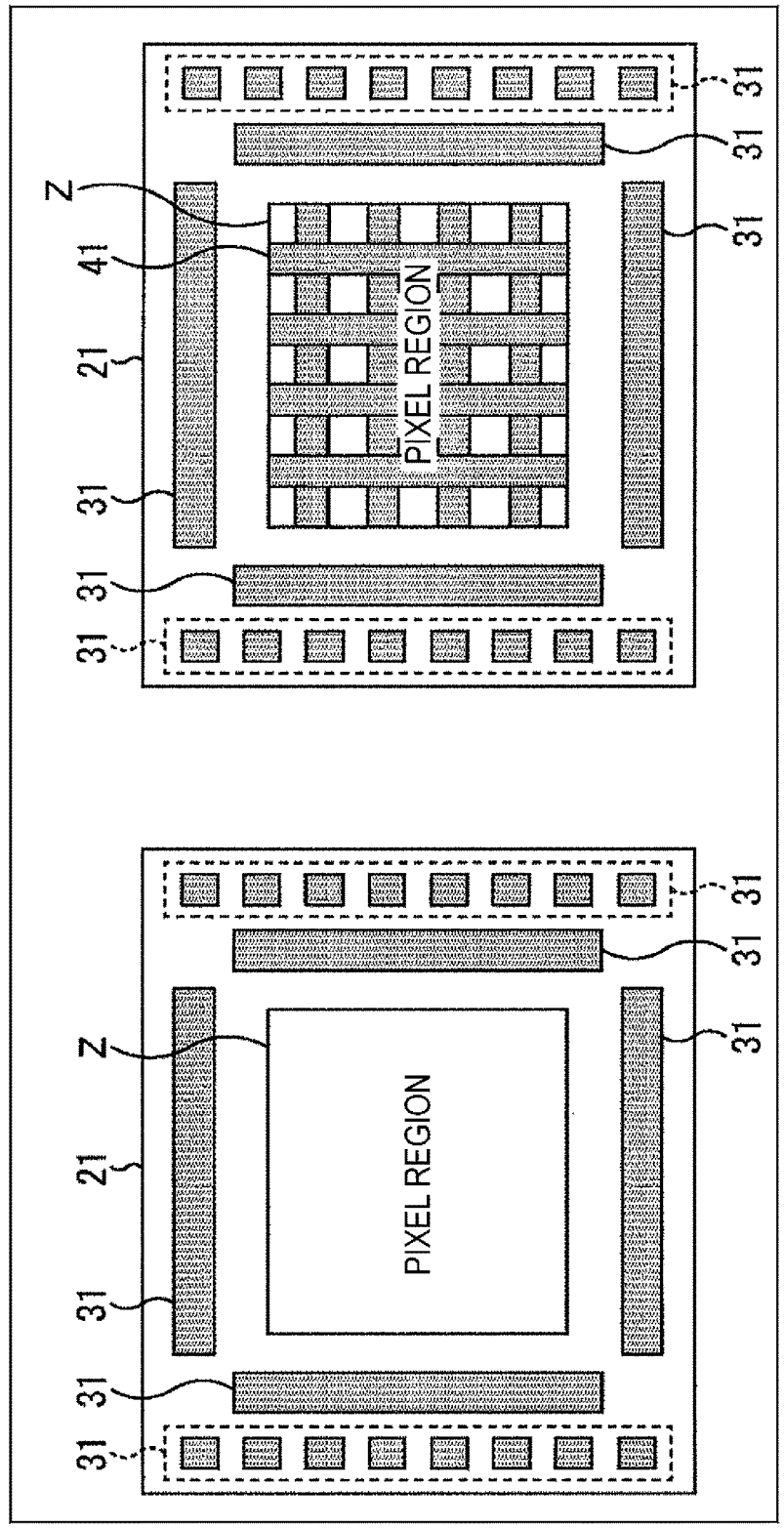
FIG. 2 is a diagram illustrating an arrangement example of wiring lines and dummy wiring lines in an uppermost layer of a wiring layer.

Necessary wiring lines of the uppermost layer of the wiring layer 21 in the back surface radiation type image sensor 11 are arranged as illustrated by wiring lines 31 of a left portion of FIG. 2. That is, in the uppermost layer of the wiring layer 21, the necessary wiring lines 31 are only arranged in a peripheral portion of a pixel region Z and rarely exist in the pixel region Z. However, because the wiring density may not be equalized in arrangements having only the necessary wiring lines as described above, an unevenness, as previously described, may exist in the polishing film 21a and the polishing film 21a may not adhere closely, or entirely, to the support substrate 24. Accordingly, an unevenness in the polishing film 21a may result in issues when adhering the polishing film 21a to the support substrate 24.

For this reason, as illustrated by a right portion of FIG. 2, in the uppermost layer of the actual wiring layer 21, dummy wiring lines 41 are provided to equalize the wiring density; the dummy wiring lines 41 may be arranged in the pixel region Z in which the wiring lines 31 are originally unnecessary. Because the dummy wiring lines 41 are arranged to equalize the wiring density in the uppermost layer of the wiring layer 21 and maintain a flatness of the polishing film 21a after the CMP, the dummy wiring lines 41 do not function as the wiring lines 31.

The wiring density in the uppermost layer of the wiring layer 21 is maintained almost equally by the dummy wiring lines 41 illustrated by the right portion of FIG. 2 and a flatness of the polishing film 21a after the CMP is obtained and/or maintained.

<Reflection by Dummy Wiring Line>

Figure 3:
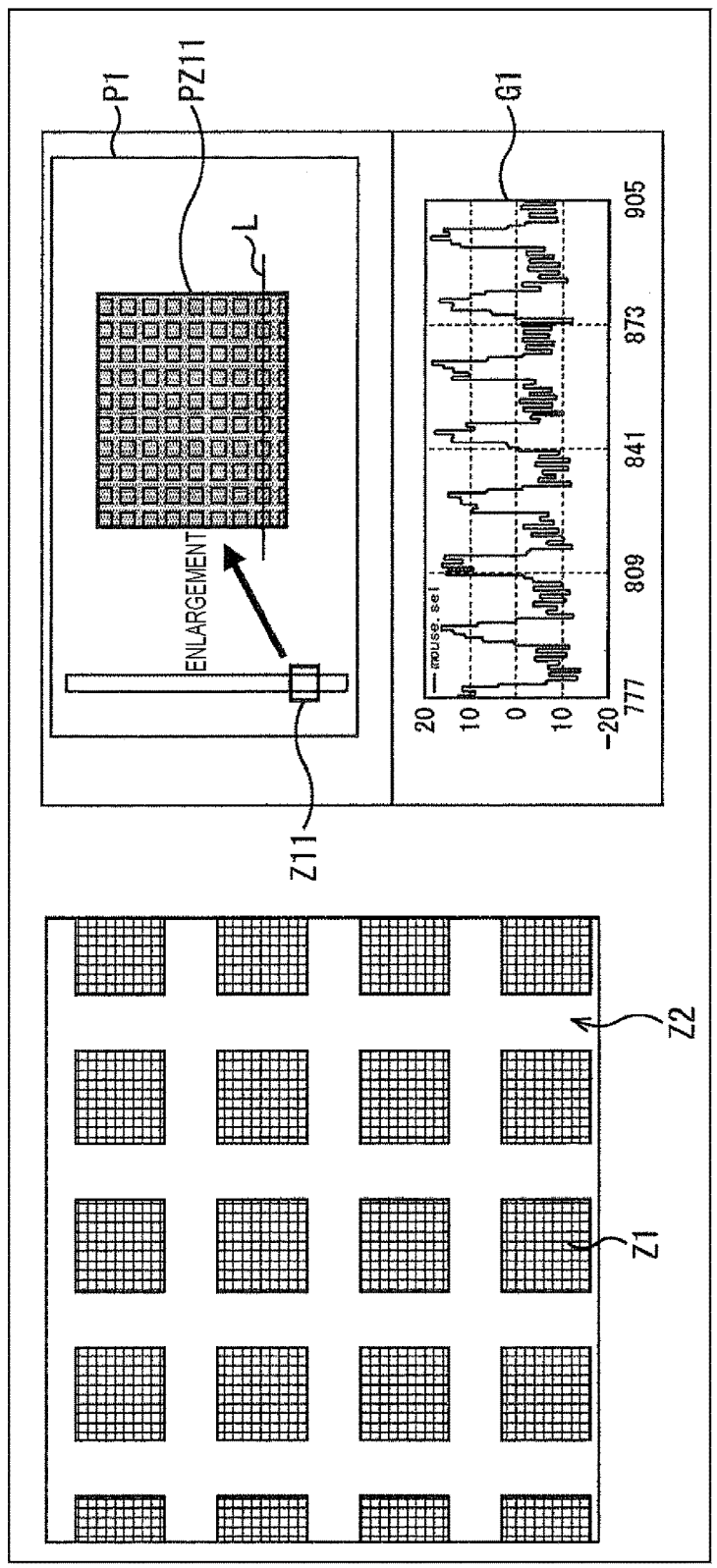
FIG. 3 is a diagram illustrating an influence of light having a long wavelength transmitting an imaging element layer and reflected by wiring lines.

However, as a method of arranging the dummy wiring lines 41 in the pixel region Z, if a pixel array is ignored and the dummy wiring lines 41 are arranged by considering only the design or the wiring density, lattice (stripe) irregularities illustrated by an upper right portion of FIG. 3 may occur.

For example, in an upper right portion of FIG. 3, bright stripe irregularities (e.g. a lattice irregularity) are displayed as illustrated by an image PZ11 displayed as an enlarged region Z11 in an image P1. In addition, a lower right portion of FIG. 3 illustrates a waveform diagram G1 depicting a light reception level of the imaging element on a straight line L in the image PZ11 of the upper right portion of FIG. 3. That is, on the straight line L in the image PZ11, a light reception level of a region where a white lattice irregularity occurs is high and a light reception level of the other region is low.

Such irregularities may be generated when incident light having a longer wavelength is transmitted through the imaging element layer 22, and is reflected by the dummy wiring lines 41, such that the light having the longer wavelength is received by the imaging element layer 22 again.

Figure 4:
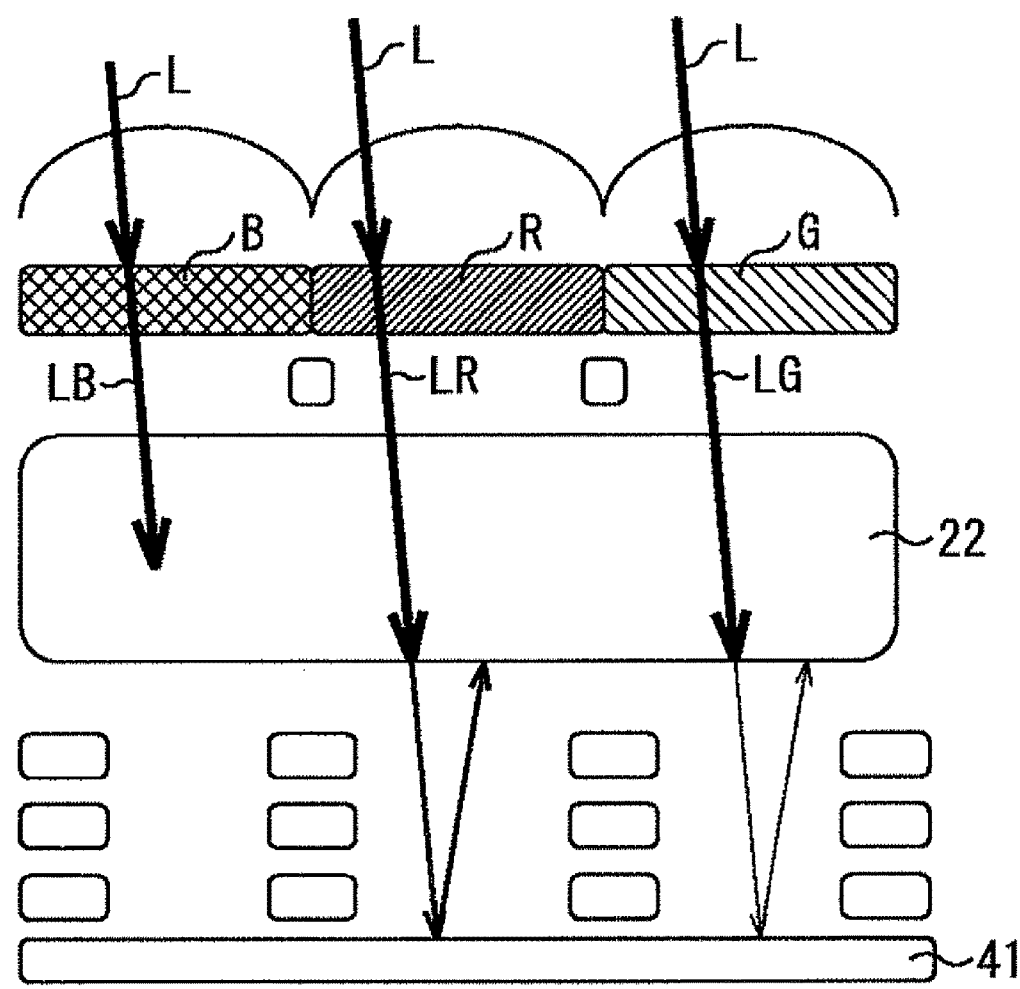
FIG. 4 is a diagram illustrating an influence of light having a long wavelength transmitting an imaging element layer and reflected by wiring lines.

As illustrated by FIG. 4, if incidence light L is converted into blue light LB, red light LR, and green light LG by blue, red, and green color filters BRG respectively, the light incident on the imaging element layer 22 is converted into a light reception signal by the imaging element of the imaging element layer 22. At this time, a portion of light having a longer wavelength, particularly, the red light LR and the green light LG, may not be absorbed by the imaging element layer 22 made of silicon Si (Epi); accordingly, such light may be transmitted through the imaging element layer 22 and may be reflected by the dummy wiring lines 41 of the wiring layer 21, such that the reflected light is incident on the imaging element layer 22.

Figure 5:
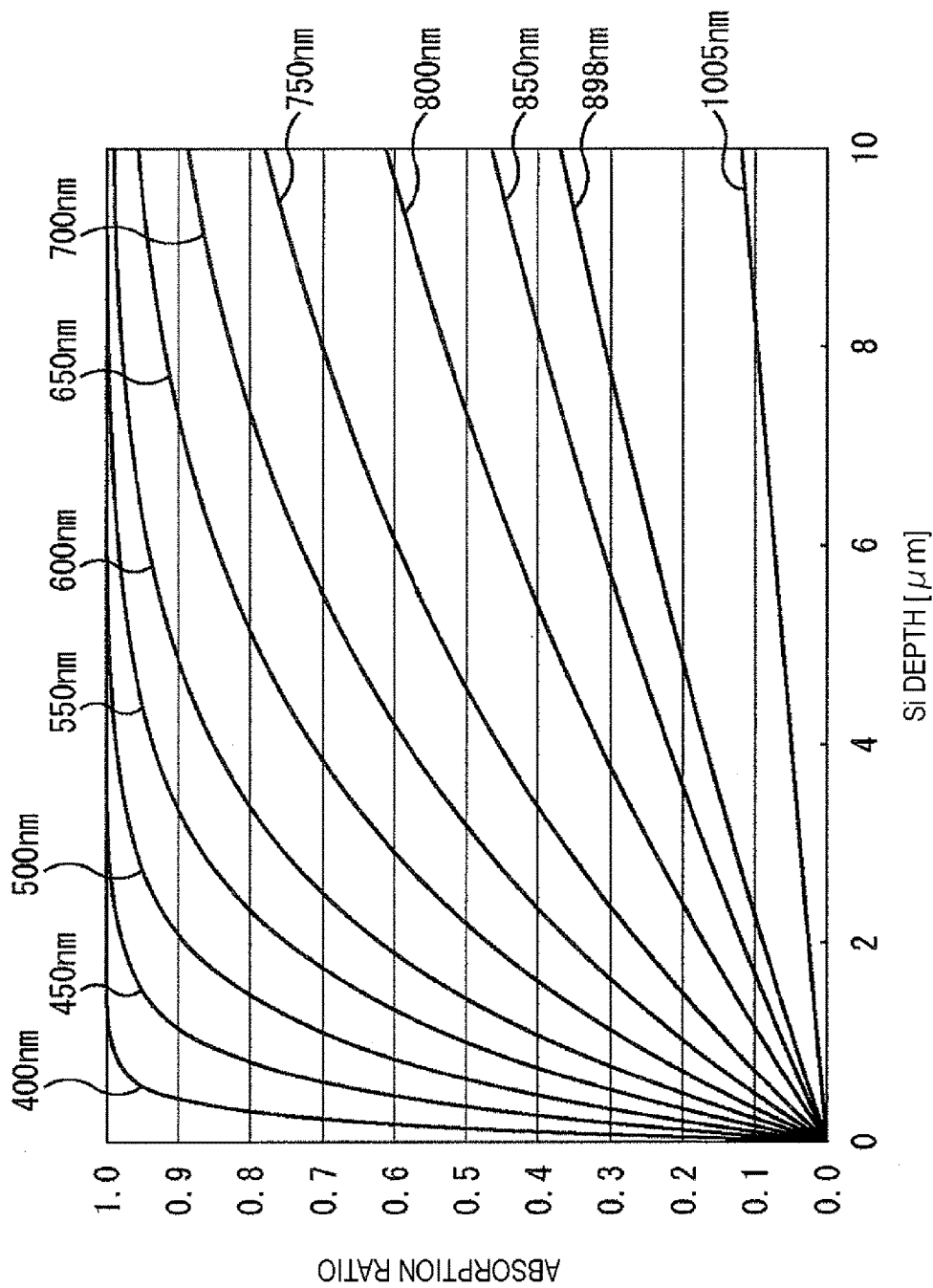
FIG. 5 is a diagram illustrating a relation of a wavelength and a transmission depth of light transmitting an imaging element layer.

FIG. 5 generally illustrates an absorption ratio (0 to 1.0) at each depth (μm)

for varying wavelengths of light; for example, light having a plurality of wavelengths ranging from 400 nm to 1005 nm may be transmitted through the silicon Si. A relation illustrated by FIG. 5 is only an example of a portion of the wavelengths of light and a similar relation may be applied to other wavelengths. As a relation between the light of other wavelengths and depths at which the light is absorbed by about 50%, the following is provided. When the wavelength of light is 460 nm, the depth at which about 50% of the light is absorbed is approximately 0.32 µm, when the wavelength of light is 530 nm, the depth at which about 50% of the light is absorbed is approximately 0.79 µm, when the wavelength of light is 610 nm, the depth at which about 50% of the light is absorbed is approximately 1.50 µm, and when the wavelength of light is 700 nm, the depth at which about 50% of the light is absorbed is approximately 3.00 µm.

In general, the thickness of the imaging element layer 22 of the back surface radiation type image sensor 11 is, for example, about 2.6 µm to 3.0 µm.

For this reason, in the case in which the wavelength of the red light LR is about 650 nm, as illustrated by FIG. 5, if the thickness of the imaging element layer 22 is about 3.0 µm, about 40% of the light is transmitted through the imaging element layer 22 and may be reflected by the dummy wiring lines 41. In addition, in the case in which the wavelength of the green light LG is about 550 nm, if the thickness of the imaging element layer 22 is about 3.0 µm, about 10% of the light is transmitted through the imaging element layer 22 and may be reflected by the dummy wiring lines 41.

For this reason, in the imaging element receiving the red light LR and the green light LG, because both directly incident light and light reflected by the dummy wiring lines 41 and then incident are received, a light reception level increases. That is, for the imaging elements receiving the red light LR and/or the green light LG, the reception level may be improperly increased because the imaging element receives both light directly incident on the imaging element and light that has been reflected by the dummy wiring lines 41. In particular, because a transmission ratio of the red light LR for the imaging element layer 22 is at a high level, the red light is received more brightly than other colors of light.

As such, the portion of the red light LR or the green light LG is transmitted through the imaging element layer 22 and is reflected by the dummy wiring lines 41; the region where the light reception level increases becomes a lattice white portion such as in the image PZ11 of the upper right portion of FIG. 3 and the light reception level of the other region is low. For at least this reason, the lattice irregularity occurs. As illustrated by a region Z2 in a left portion of FIG. 3, a region where a light reception level increases and light is received brightly is a region where the dummy wiring lines 41 exist and the other region Z1 becomes a region where the dummy wiring lines 41 do not exist. The left portion of FIG. 3 is displayed by enlarging the lattice irregularity in the image PZ11 in the upper right portion of FIG. 3.

<Example of Dummy Wiring Line in Uppermost Layer of Wiring Layer>

Figure 6:
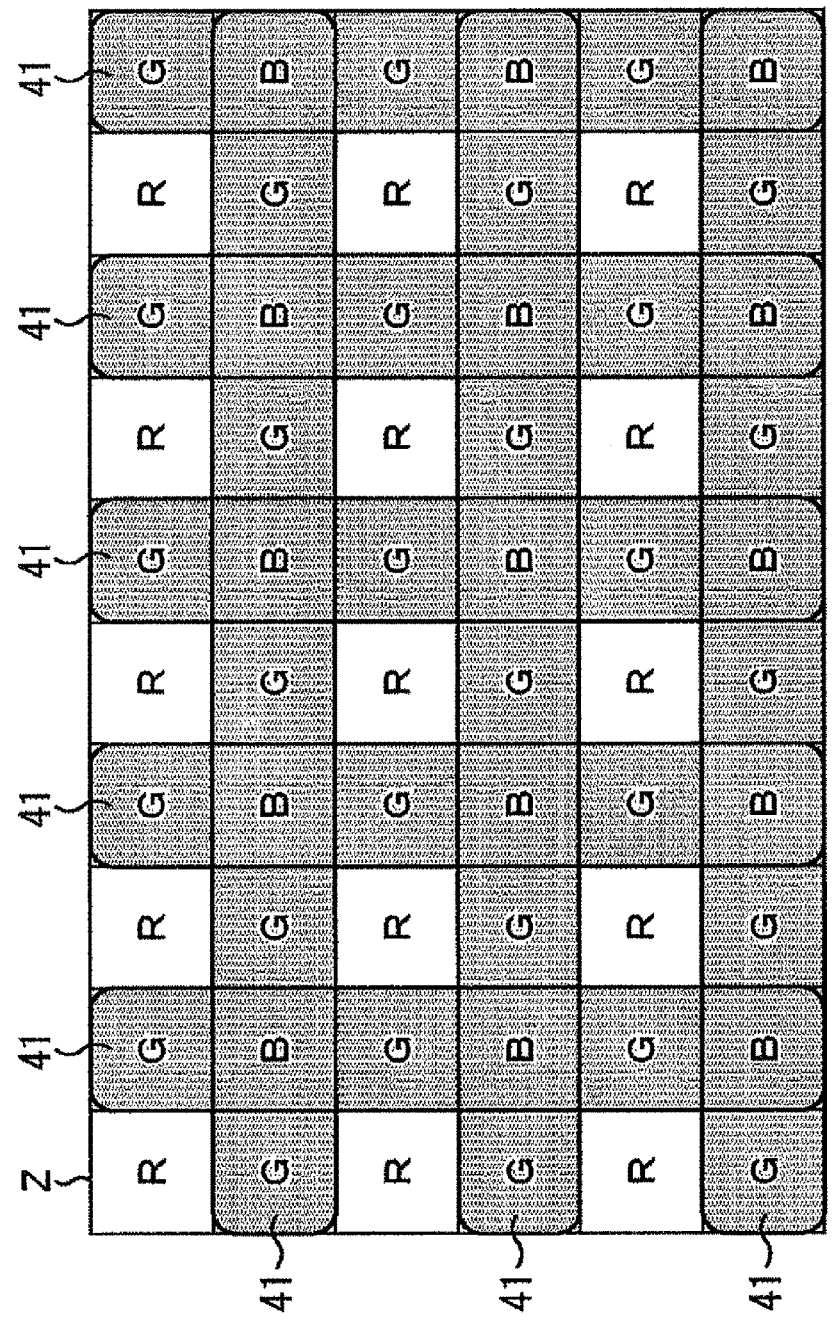
FIG. 6 is a diagram illustrating an arrangement example of dummy wiring lines in a first embodiment.

Therefore, in the back surface radiation type image sensor 11 to which the present technology is directed, as illustrated by FIG. 6, the dummy wiring lines 41 are arranged in a pixel region Z of the uppermost layer of the wiring layer 21.

That is, as illustrated by FIG. 6, in the pixel region Z of a pixel array, the dummy wiring lines 41 of a pixel width are arranged only at positions corresponding to pixels (B pixels and G pixels) in which blue and green color filters B and G transmit blue light LB and green light LG having the relatively shorter wavelengths are arranged. That is, the width of the dummy wiring lines 41 may be substantially similar to the width of a pixel.

As such, the dummy wiring lines 41 of a pixel width are not arranged in a region in which pixels (hereinafter, also called the R pixels) where red color filters R are arranged exist; accordingly, the red light LR having the longer wavelengths is received in the pixel region Z. Therefore, even though the red light LR may transmit through the imaging element layer 22, reflection of such transmitted light by the dummy wiring lines 41 can be reduced.

As a result, because light reflected by the dummy wiring lines 41 is not incident on the imaging element layer 22, the occurrence of the lattice irregularity (stripe irregularity) is reduced. In addition, because the wiring density in the polishing film 21a of the wiring layer 21 can be almost equalized as a whole (that is, the wiring density within the pixel region z may be substantially equal for all pixels), the occurrence of the lattice irregularity can be suppressed while the achieving a desired flatness of the polishing film 21a by the CMP. FIG. 6, illustrates an array of pixels in the pixel region Z; R, G, and B pixels are displayed as "R", "G", and "B".

2. Second Embodiment

<Dummy Wiring Line Made of Narrow Wiring Line>

The example of the case in which the dummy wiring lines 41 have a pixel width has been described above. However, if the dummy wiring lines 41 have the pixel width, the red light LR or the green light LG of the adjacent pixels may be transmitted through the imaging element layer 22 and thus may be reflected. Therefore, the dummy wiring lines 41 may be configured of narrower wiring lines having a width smaller than that of a pixel width.

Figure 7:
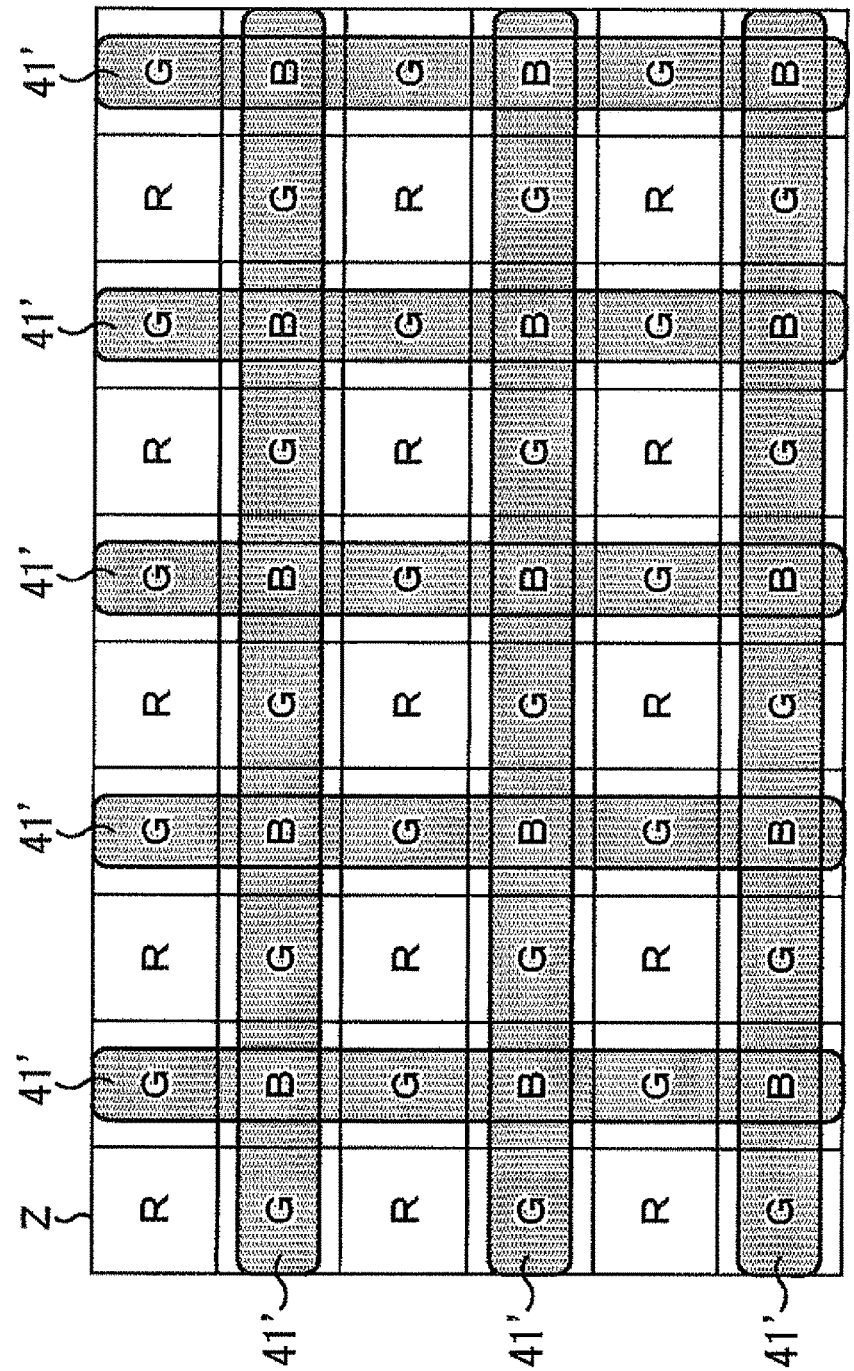
FIG. 7 is a diagram illustrating an arrangement example of dummy wiring lines in a second embodiment.

FIG. 7 illustrates a wiring example in the uppermost layer of the wiring layer 21 in the pixel region Z in which dummy wiring lines 41' made of narrow wiring lines are utilized as the dummy wiring lines 41.

That is, as illustrated by FIG. 7, in the pixel region Z, the dummy wiring lines 41' made of narrow wiring lines having a width that is smaller than a pixel width are arranged at positions only corresponding to regions where the B pixels and the G pixels are arranged, according to the pixel array.

As such, the narrow wiring lines are arranged as illustrated by the dummy wiring lines 41' made of the narrow wiring lines in the uppermost layer of the wiring layer 21 of FIG. 7. Therefore, even though the red light LR in the pixels where the adjacent color filters R are arranged or the green light LG in the pixels where the color filters G are arranged may transmit through the imaging element layer 22, a reflection of the transmitted light can further be suppressed. As a result, the occurrence of the lattice irregularity can be further suppressed while the flatness of the polishing film 21a by the CMP is maintained.

3. Third Embodiment

<Example of Case of Arranging Dummy Wiring Line in Only B Pixel>

The example of the case in which the dummy wiring lines 41 are arranged in the regions of the B pixels and the G pixels in the pixel region Z has been described. However, because a portion of the green light LG transmits through the imaging element layer 22 in regions where the G pixels exist, the green light may be reflected by the dummy wiring lines 41 (or the dummy wiring lines 41' made of the narrow wiring lines). Therefore, the dummy wiring lines 41 (or the dummy wiring lines 41' made of the narrower wiring lines) may be arranged only in the regions where the B pixels exist.

Figure 8:
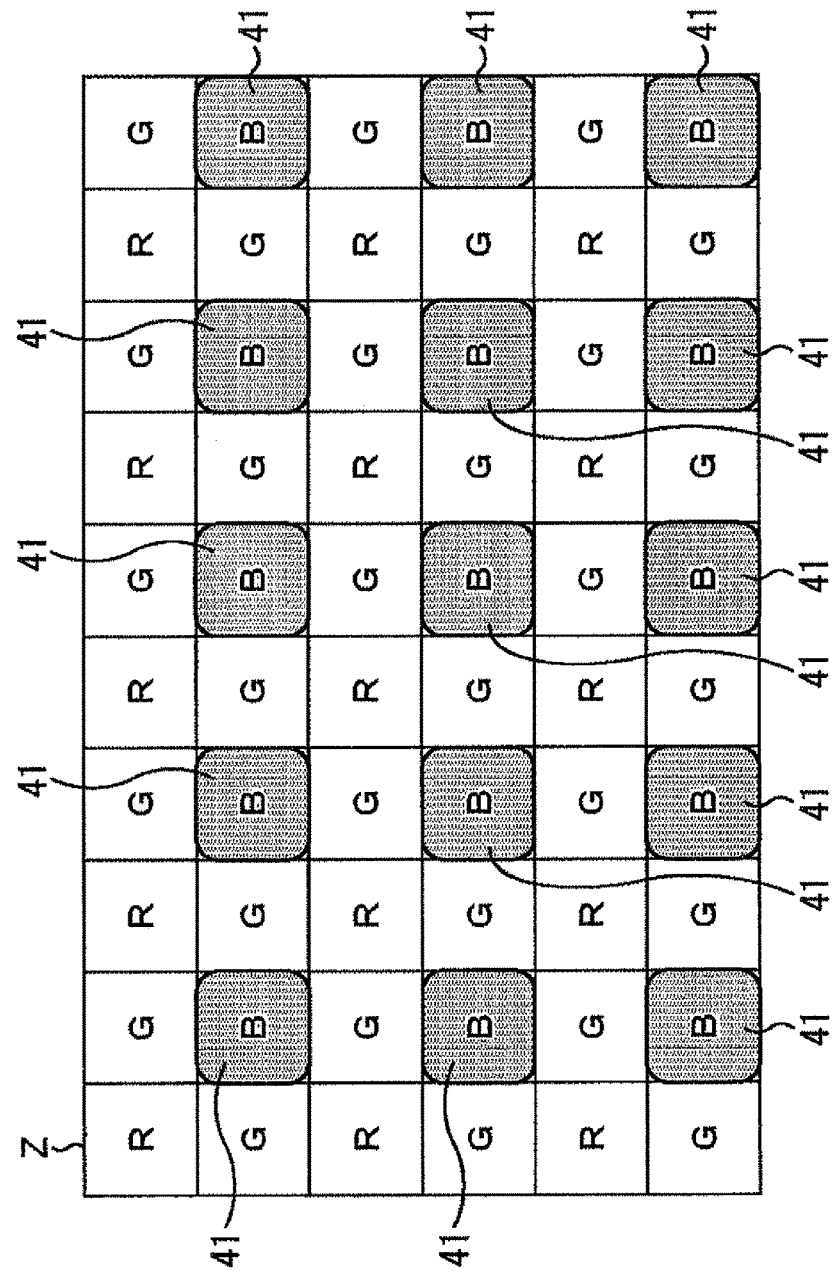
FIG. 8 is a diagram illustrating an arrangement example of dummy wiring lines in a third embodiment.

FIG. 8 illustrates a wiring example of the case in which the dummy wiring lines 41 are arranged only in the regions where the B pixels in the uppermost layer of the wiring layer 21 in the pixel region Z exist. That is, as illustrated by FIG. 8, in the pixel region Z, the dummy wiring lines 41 having a pixel width are arranged only at positions corresponding to the pixels where the B pixels are arranged.

As such, the dummy wiring lines 41 are arranged only in the B pixels as illustrated by the dummy wiring lines 41 in the uppermost layer of the wiring layer 21 of FIG. 8. Therefore, even though the red light LR and the green light LG may be reflected by the dummy wiring lines 41, the reflection thereof can be suppressed. As a result, the occurrence of the lattice irregularity can be further suppressed while the flatness of the polishing film 21*a* by the CMP is maintained. Although not illustrated in the drawings, instead of the dummy wiring lines 41, the dummy wiring lines 41' made of the narrower wiring lines may be arranged. The dummy wiring lines 41' made of the narrow wiring lines are arranged, so that the reflection from the adjacent G and R pixels is further decreased.

4. Fourth Embodiment

<Arrangement of Dummy Wiring Line in Only B Pixel Among Four Pixels of RGBW>

The example of the case in which the dummy wiring lines 41 are arranged in the regions of the B pixels and the G pixels among the RGB pixels in the pixel region Z or the positions corresponding to the B pixels has been described above. However, in the pixel region Z including the RGB pixels and pixels where white color filters W are arranged (hereinafter, also called the W pixels), the dummy wiring lines 41 may be arranged for only the B pixels among the RGBW pixels.

Figure 9:
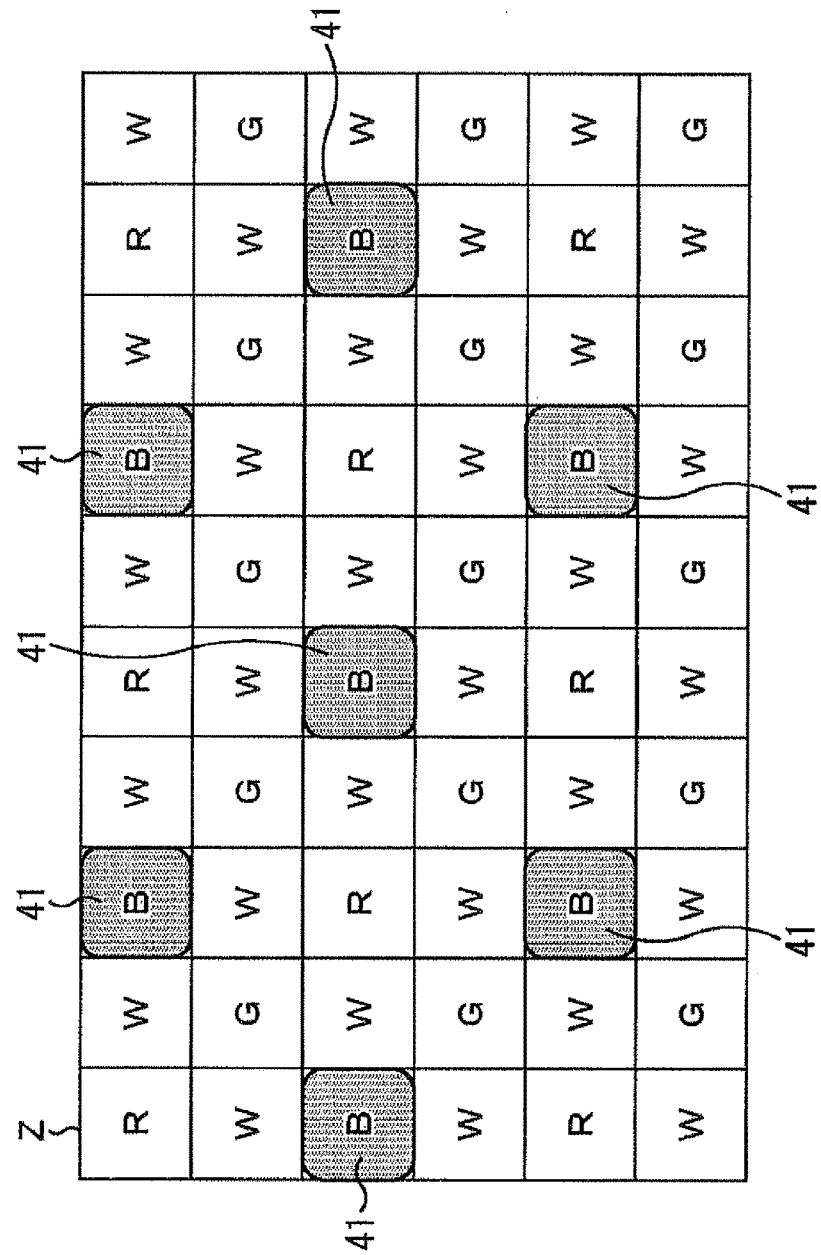
FIG. 9 is a diagram illustrating an arrangement example of dummy wiring lines in a fourth embodiment.

FIG. 9 illustrates a wiring example in which the dummy wiring lines 41 are arranged only in the regions where the B pixels in the uppermost layer of the wiring layer 21 of the pixel region Z including the RGBW pixels exist. As such, the dummy wiring lines 41 are arranged in only the B pixels as illustrated by the dummy wiring lines 41 in the uppermost layer of the wiring layer 21 of FIG. 9. Therefore, even though the red light LR, the green light LG, and white light LW (the red light LR and the green light LG included therein) including components reflected by the dummy wiring lines 41 transmit through the imaging element layer 22, the reflection thereof can be suppressed. As a result, the occurrence of lattice irregularities can be further suppressed while the flatness of the polishing film 21*a* by the CMP is maintained. Although not illustrated in the drawings, instead of the dummy wiring lines 41, the dummy wiring lines 41' made of the narrower wiring lines may be arranged. The dummy wiring lines 41' made of the narrow wiring lines are arranged, so that the reflection from the adjacent G and R pixels can be further decreased. However, because a transmission ratio of the green light LG transmitting the G pixels for the imaging element layer 22 is relatively low, the dummy wiring lines 41 (or 41') may be arranged for the G pixels in addition to the B pixels.

5. Fifth Embodiment

<Arrangement of Dummy Wiring Lines in B and G Pixels Among Four Pixels of RGB-IR>

The example of the case in which the dummy wiring lines 41 are arranged only at the positions corresponding to the regions of the B pixels among the RGBW pixels in the pixel region Z has been described above. However, in the pixel region Z that includes the RGB pixels and pixels where color filters IR of infrared light are arranged (hereinafter, also called the IR pixels), the dummy wiring lines 41 may be arranged for the B and G pixels among the pixels RGB-IR.

Figure 10:
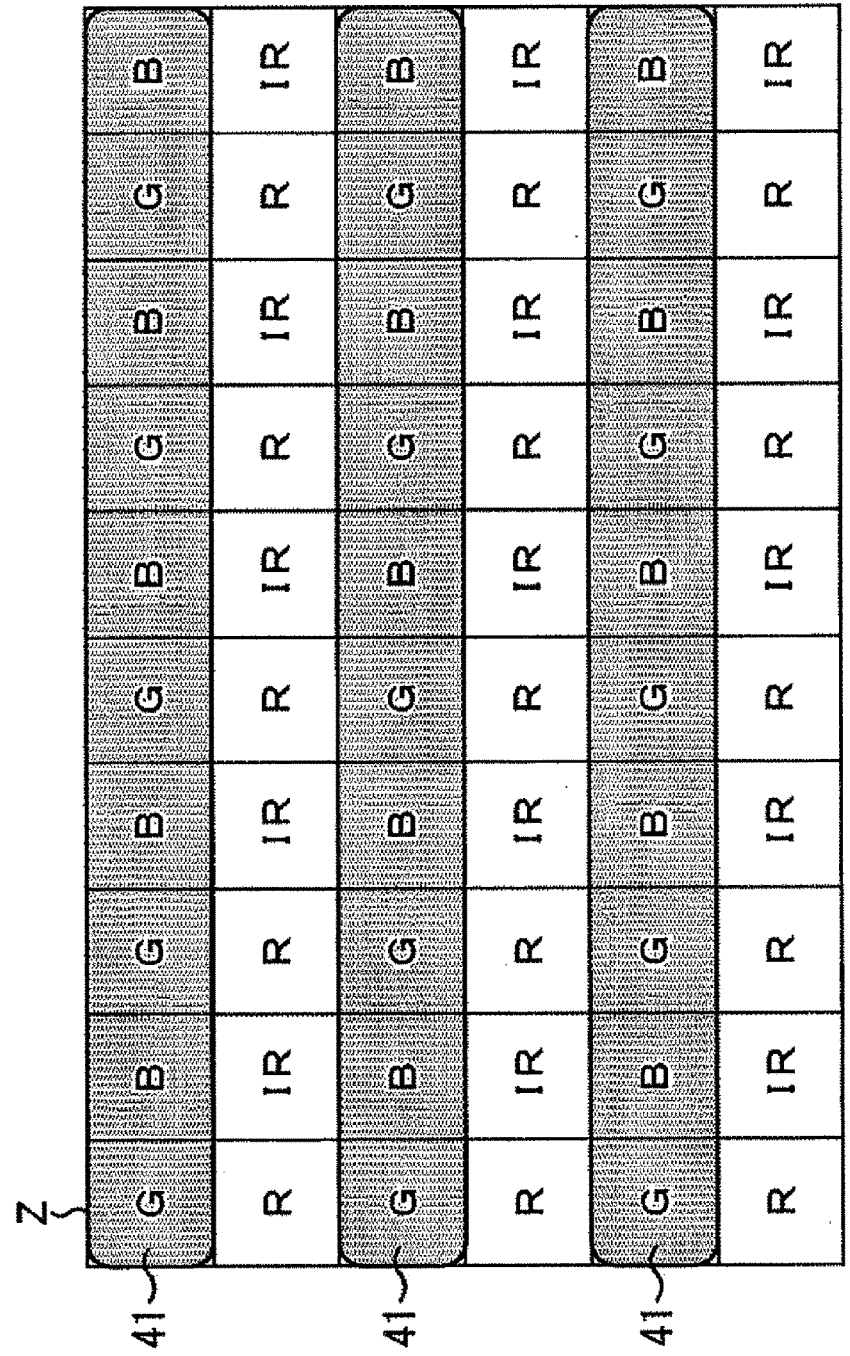
FIG. 10 is a diagram illustrating an arrangement example of dummy wiring lines in a fifth embodiment.

FIG. 10 illustrates a wiring example of the case in which the dummy wiring lines 41 are arranged only in the regions where the B and G pixels in the uppermost layer of the wiring layer 21 in the pixel region Z including the RGB-IR pixels exist.

As such, the dummy wiring lines 41 are arranged only at the positions corresponding to the B and G pixels as illustrated by the dummy wiring lines 41 in the uppermost layer of the wiring layer 21 of FIG. 10. Therefore, even though the red light LR and the infrared light LIR including components reflected by the dummy wiring lines 41 transmit through the imaging element layer 22, the reflection thereof can be suppressed. As a result, the occurrence of the lattice irregularity can be suppressed while the flatness of the polishing film 21*a* by the CMP is maintained.

6. Sixth Embodiment

<Arrangement of Dummy Wiring Lines Made of Narrow Wiring Lines in Only B and G Pixels Among Four Pixels of RGB-IR>

The example of the case in which the dummy wiring lines 41 are arranged at the positions corresponding to the regions of the B and G pixels among the RGB-IR pixels in the pixel region Z has been described above. However, instead of the dummy wiring lines 41, the dummy wiring lines 41' made of the narrow wiring lines may be arranged.

Figure 11:
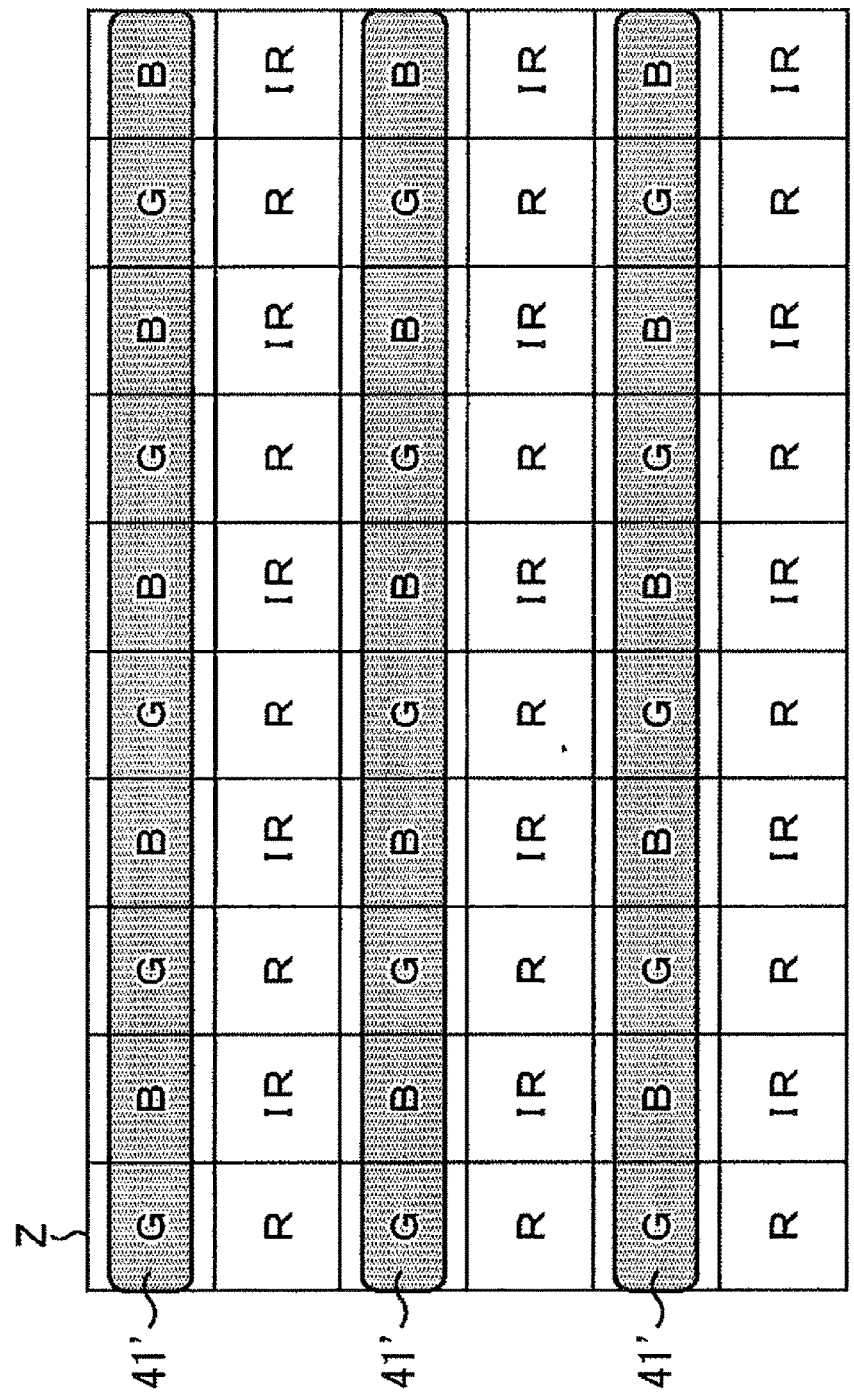
FIG. 11 is a diagram illustrating an arrangement example of dummy wiring lines in a sixth embodiment.

FIG. 11 illustrates a wiring example of the case in which the dummy wiring lines 41' made of the narrow wiring lines are arranged only in the regions where the B and G pixels in the uppermost layer of the wiring layer 21 in the pixel region Z including the RGB-IR pixels exist.

As such, the dummy wiring lines 41' are arranged at only the positions corresponding to the B and G pixels as illustrated by the dummy wiring lines 41' made of the narrow wiring lines in the uppermost layer of the wiring layer 21 of FIG. 11. Therefore, even though the red light LR and the infrared light LIR including components reflected by the dummy wiring lines 41' transmit through the imaging element layer 22, the reflection thereof can be further suppressed. As a result, the occurrence of the lattice irregularity can be further suppressed while the flatness of the polishing film 21*a* by the CMP is maintained.

7. Seventh Embodiment

Arrangement of Dummy Wiring Line in Only B Pixel Among Four Pixels of RGB-IR>

The example of the case in which the dummy wiring lines 41' are arranged only at the positions corresponding to the regions of the B and G pixels among the RGB-IR pixels in the pixel region Z has been described above. However, the dummy wiring lines 41 may be arranged only at the positions of the B pixels.

Figure 12:
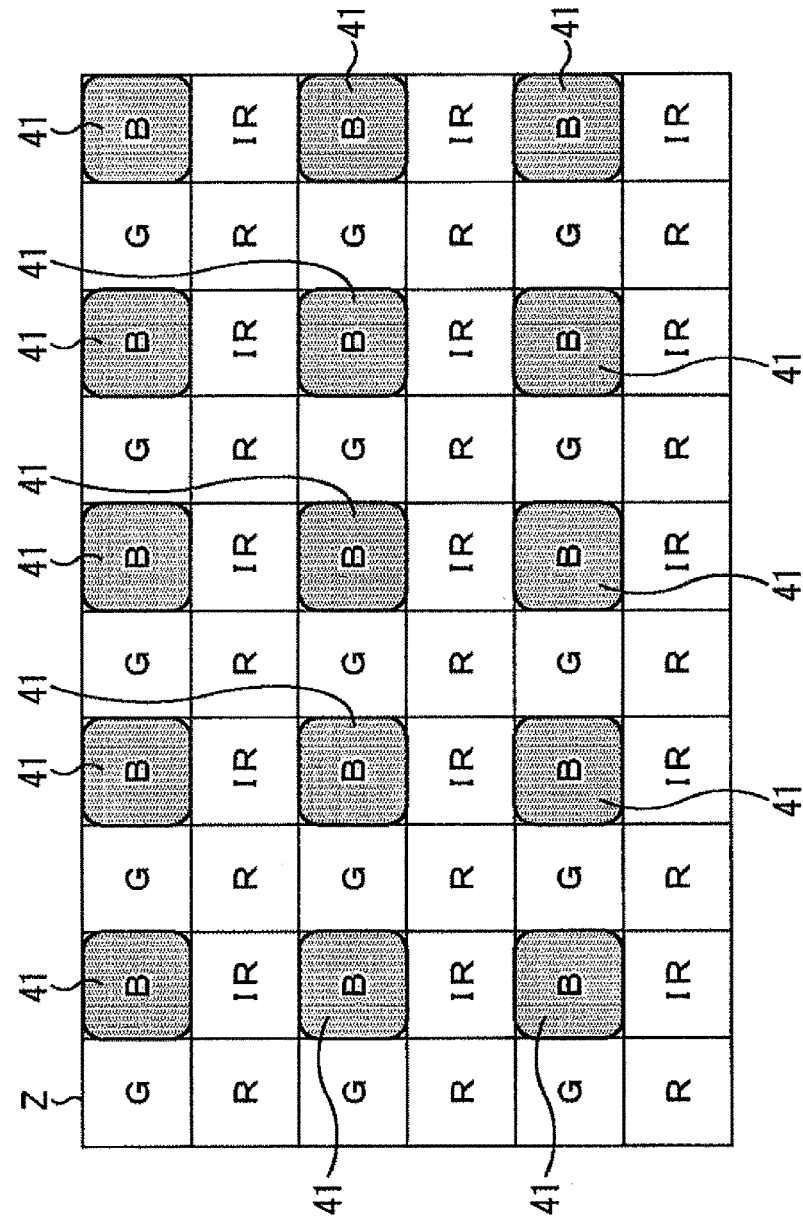
FIG. 12 is a diagram illustrating an arrangement example of dummy wiring lines in a seventh embodiment.

FIG. 12 illustrates a wiring example of the case in which the dummy wiring lines 41 are arranged only in the regions where the B pixels in the uppermost layer of the wiring layer 21 in the pixel region Z including the RGB-IR pixels exist.

As such, the dummy wiring lines 41 are arranged only at the positions corresponding to the B pixels as illustrated by the dummy wiring lines 41 in the uppermost layer of the wiring layer 21 of FIG. 12. Therefore, even though the red light LR, the green light LG, and the infrared light LIR, including components reflected by the dummy wiring lines 41, transmit through the imaging element layer 22, the reflection thereof can be further suppressed. As a result, the occurrence of the lattice irregularity can be suppressed while the flatness of the polishing film 21a by the CMP is maintained.

Although not illustrated in the drawings, instead of the dummy wiring lines 41, the dummy wiring lines 41' made of the narrow wiring lines may be utilized and arranged. The dummy wiring lines 41' made of the narrow wiring lines are arranged, so that reflection of the green light LG, the red light LR, and the infrared light LIR of the adjacent G, R, and IR pixels can be further decreased.

<Color and Wavelength of Pixel>

The example of the case in which the arrangement positions of the dummy wiring lines 41 (or the dummy wiring lines 41' made of the narrow wiring lines) are specified according to the positions of the colors (the R pixel, the G pixel, the B pixel, the W pixel, and the IR pixel) of the light transmitting to the pixels has been described. However, the dummy wiring lines 41 (or the dummy wiring lines 41' made of the narrow wiring lines) may be arranged to correspond to the pixels of colors of the wavelengths shorter than the predetermined wavelengths.

Figure 13:
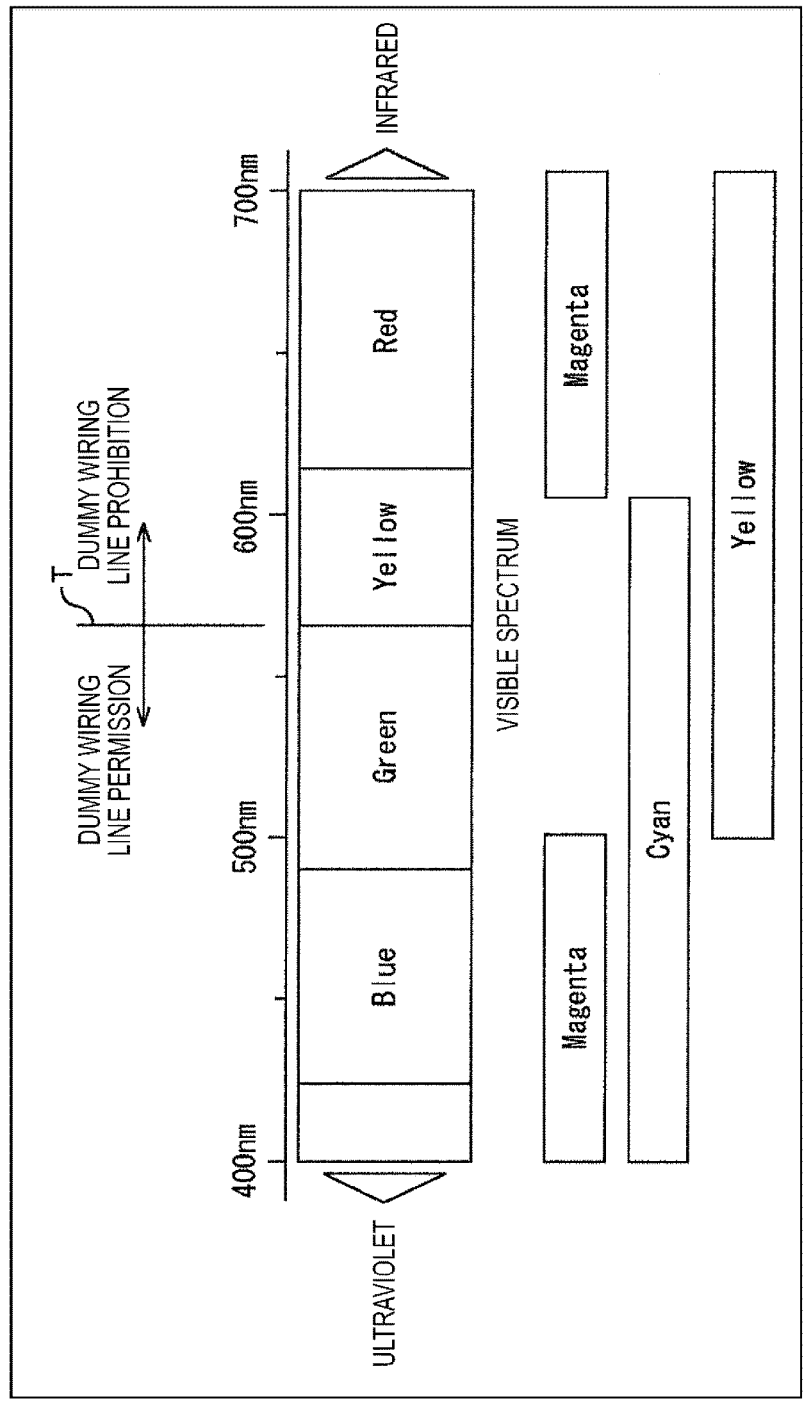
FIG. 13 is a diagram illustrating a relation of a wavelength of incidence light and a color of light received by each pixel.

That is, for example, as illustrated by FIG. 13, when 570 nm is set as a predetermined wavelength T, the dummy wiring lines 41 (or the dummy wiring lines 41' made of the narrow wiring lines) may be arranged at the positions where the pixels of a color with a wavelength shorter than the predetermined wavelength T (=570 nm) as a peak exist.

In this case, when pixels are pixels of three colors of RGB, the dummy wiring lines 41 (or the dummy wiring lines 41' made of the narrow wiring lines) may be arranged at only the positions where the B and G pixels with the wavelength shorter than the wavelength of 570 nm as a peak exist.

In addition, when pixels are pixels of three colors of magenta, cyan, and yellow (MCY), the dummy wiring lines 41 (or the dummy wiring lines 41' made of the narrow wiring lines) may be arranged only at the positions where the cyan pixels having a wavelength shorter than the wavelength of 570 nm as a peak exist.

At an upper step of FIG. 13, a color distribution set to the pixels of the additive three primary colors (RGB) with each wavelength as a peak is illustrated; at a lower portion of FIG. 13, a color distribution set to the pixels of the subtractive three primary colors (MCY) with each wavelength as a peak is illustrated. In FIG. 13, the case in which the wavelength of 570 nm is the predetermined wavelength T is illustrated. However, the predetermined wavelength T may be set to any wavelength.

When the predetermined wavelength T is set and the dummy wiring lines 41 (or the dummy wiring lines 41' made of the narrow wiring lines) are arranged at only the positions of the pixels of the color of the wavelength shorter than the wavelength of the B pixels, any wavelength of 400 nm to 600 nm may be set as the predetermined wavelength T and the dummy wiring lines 41 (or the dummy wiring lines 41' made of the narrow wiring lines) may be arranged in the pixel region in which the light of the color with the predetermined wavelength T as the peak and the light of the color of the wavelength shorter than the wavelength of the color are received. In addition, the range may be further narrowed such that any wavelength of 530 nm to 550 nm may be set as the predetermined wavelength T and the dummy wiring lines 41 (or the dummy wiring lines 41' made of the narrow wiring lines) may be arranged in the pixel region in which the light of the color with the predetermined wavelength T as the peak and the light of the color of the wavelength shorter than the wavelength of the color are received. In addition, when the dummy wiring lines 41 (or the dummy wiring lines 41' made of the narrow wiring lines) are arranged at the positions of the pixels having wavelengths shorter than the wavelength of the G pixels, for example, any wavelength of 630 nm to 650 nm may be set as the predetermined wavelength T and the dummy wiring lines 41 (or the dummy wiring lines 41' made of the narrow wiring lines) may be arranged in the pixel region in which the light of the color with the predetermined wavelength T as the peak and the light of the color of the wavelength shorter than the wavelength of the color are received.

As described above, according to the present technology, in the back surface radiation type image sensor, the influence of light reflected by the wiring lines of the wiring layer is reduced while the wiring density in the uppermost layer of the wiring layer is equalized, so that noise can be decreased and a high image quality can be realized.

Figure 14:
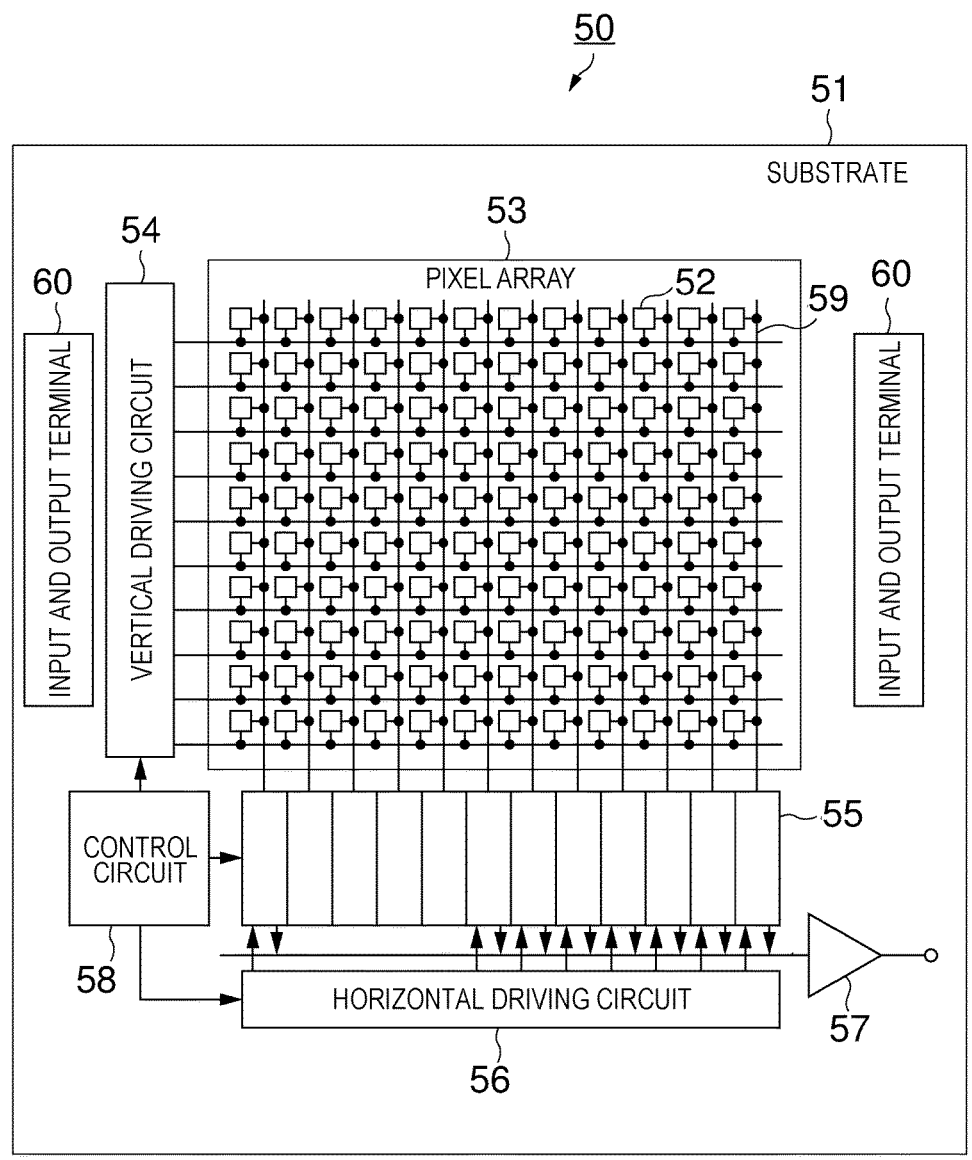
FIG. 14 is a diagram illustrating a schematic configuration of a solid-state imaging device to which the present technology is applied.

FIG. 14 is a diagram illustrating a schematic configuration of a solid-state imaging device to which the present technology is applied. This solid-state imaging device 50 includes, for example, a CMOS image sensor.

The solid-state imaging device 50 of FIG. 14 includes a pixel region (a so-called pixel array) 53 in which pixels 52 including a plurality of photoelectric conversion portions are regularly arranged in a two-dimensional array on the semiconductor substrate 51 and a peripheral circuit portion.

Each of the pixels 52 includes, for example, a photodiode which is the photoelectric conversion portion and a plurality of pixel transistors (so-called MOS transistors).

In addition, the pixels 52 may have a shared pixel structure. This pixel shared structure is formed by a plurality of photodiodes, a plurality of transfer transistors, a single shared floating diffusion, and another shared transistor.

The peripheral circuit portion includes a vertical driving circuit 54, a column signal processing circuit 55, a horizontal driving circuit 56, an output circuit 57, a control circuit 58, and the like.

The control circuit 58 receives an input clock and data for commanding an operation mode and the like, and outputs data such as internal information of the solid-state imaging device. In other words, the control circuit 58 generates a clock signal used as a reference of operations of the vertical driving circuit 54, the column signal processing circuit 55, the horizontal driving circuit 56, and the like, and control signals on the basis of a vertical synchronization signal, a horizontal synchronization signal, and a master clock. In addition, these signals are input to the vertical driving circuit 54, the column signal processing circuit 55, the horizontal driving circuit 56, and the like.

The vertical driving circuit 54 including, for example, shift registers, selects a pixel driving line, and supplies a pulse for driving the pixels to the selected pixel driving line so as to drive the pixels in the unit of a row. In other words, the vertical driving circuit 54 sequentially selectively scans the respective pixels 52 of the pixel region 53 in the vertical direction in the unit of a row, and supplies a pixel signal based on signal charge which is generated according to a light receiving amount in, for example, the photodiode which is a photoelectric conversion portion of each pixel 52, to the column signal processing circuit 55 via a vertical signal line 59.

The column signal processing circuit 55 is disposed, for example, for each column of the pixels 52, and performs a signal process such as noise removal on signals output from the pixels 52 of one row for each pixel column. In other words, the column signal processing circuit 55 performs signal processes such as CDS for removing fixed pattern noise unique to the pixels 52, signal amplification, and AD conversion. In an output end of the column signal processing circuit 55, a horizontal selection switch (not shown) is provided so as to be connected to a horizontal signal line 61.

The horizontal driving circuit 56 includes, for example, shift registers, sequentially outputs horizontal scanning pulses so as to sequentially select the respective column signal processing circuits 55, thereby outputting a pixel signal from each of the column signal processing circuits 55 to the horizontal signal line 61.

The output circuit 57 performs a signal process on the signals which are sequentially supplied from the respective column signal processing circuits 55 via the horizontal signal line 61 so as to be output. For example, only buffering may be performed, or black level adjustment, column disparity correction, a variety of digital signal processes, and the like may be performed. An input and output terminal 60 sends and receives signals to and from an external device.

The solid-state imaging device 51 shown in FIG. 14 includes a rear surface irradiation type CMOS image sensor with a three-layer stacked structure. For example, the pixels 52 shown in FIG. 14 are sensor circuits formed in the first semiconductor substrate, and the peripheral circuits are logical circuits formed in the second semiconductor substrate or memory circuits formed in the third semiconductor substrate.

Figure 15:
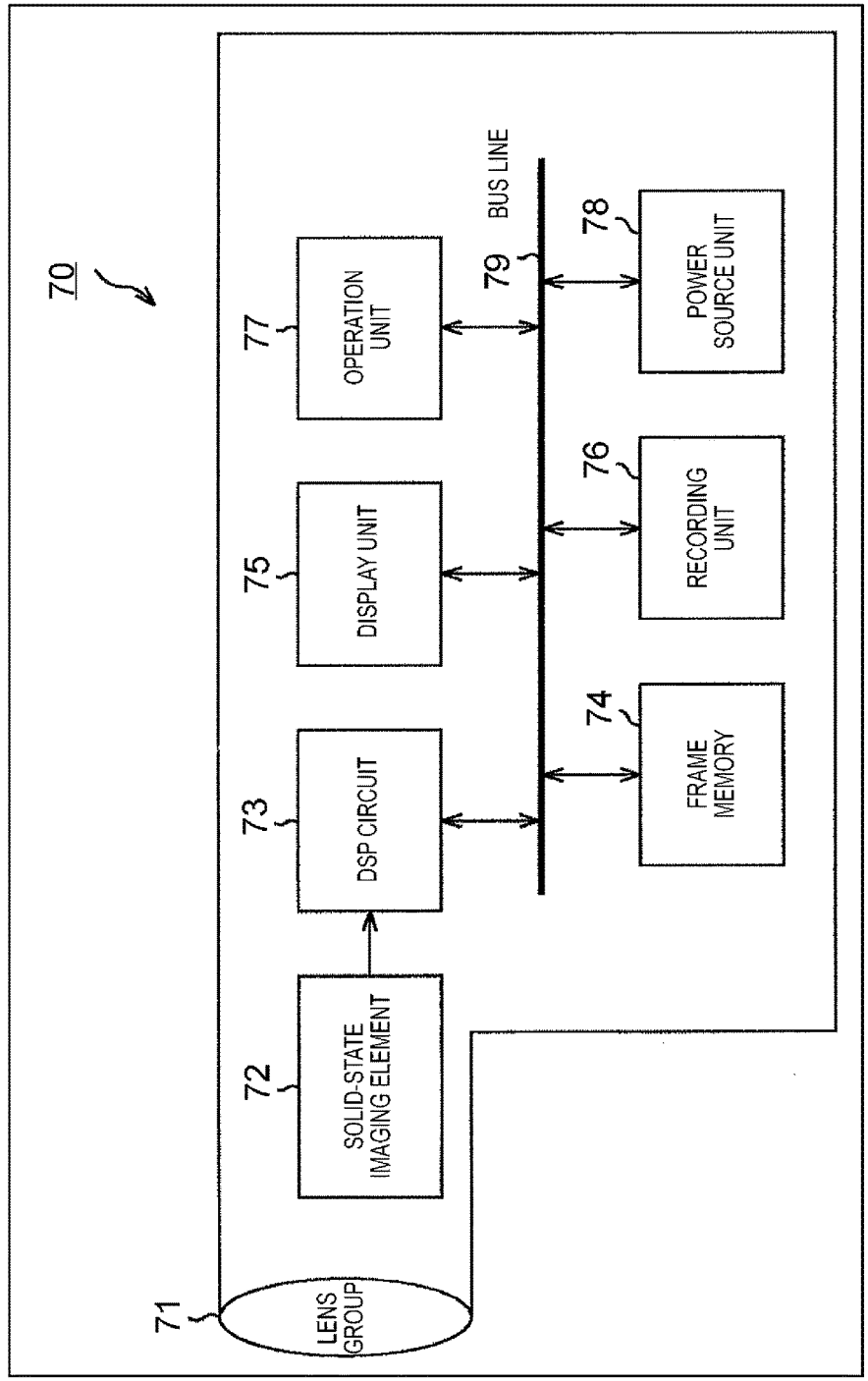
FIG. 15 is a block diagram illustrating a configuration example of an electronic apparatus to which the present technology is applied.

FIG. 15 is a block diagram illustrating a configuration example of a camera apparatus which is an electronic apparatus to which the present technology is applied.

A camera apparatus 70 in FIG. 15 includes an optical unit 71 including a lens group and the like, a solid-state imaging device (imaging device) 72 which employs the above-described respective configurations of the pixels 72, and a DSP circuit 73 which is a camera signal processing circuit. In addition, the camera apparatus 70 includes a frame memory 74, a display unit 75, a recording unit 76, an operation unit 77, and a power supply unit 78. The DSP circuit 73, the frame memory 74, the display unit 75, the recording unit 76, the operation unit 77, and the power supply unit 78 are connected to each other via a bus line 79.

The optical unit 71 receives incident light (image light) from a subject so as to be imaged on an imaging surface of the solid-state imaging device 72. The solid-state imaging device 72 converts a light amount of the incident light which is imaged on the imaging surface by the optical unit 71 into an electric signal in the unit of a pixel and outputs the electric signal as a pixel signal. The solid-state imaging device related to the above-described embodiments may be used as the solid-state imaging device 72.

The display unit 75 includes, for example, a panel type display device such as a liquid crystal panel or an organic electroluminescence (EL) panel, and displays moving images or still images captured by the solid-state imaging device 72. The recording unit 76 records moving images or still images captured by the solid-state imaging device 72 on a recording medium such as a video tape or a digital versatile disk (DVD).

The operation unit 77 issues operation commands for various functions of the camera apparatus 70 in response to an operation by a user. The power supply unit 78 appropriately supplies a variety of power which is operation power of the DSP circuit 73, the frame memory 74, the display unit 75, the recording unit 76, and the operation unit 77, to the supply targets.

The present technology can have the following configuration.

(1) A solid-state imaging device comprising:
a substrate; and
an imaging element layer having a plurality of imaging elements, the imaging element layer located between the substrate and a wiring layer having a plurality of wiring lines, wherein wiring lines of the wiring layer are arranged in pixel regions configured to receive light having a wavelength less than a predetermined wavelength.

(2) The solid-state imaging device according to (1), wherein the wiring lines of the wiring layer are not arranged in pixel regions configured to receive light having a wavelength greater than the predetermined wavelength.

(3) The solid-state imaging device according to any one of (2) and (3), wherein the wiring lines of the wiring layer arranged in pixel regions configured to receive light are located below one or more imaging elements configured to receive light having a wavelength less than the predetermined wavelength.

(4) The solid-state imaging device according to any one of (1) to (3), wherein the plurality of imaging elements located within the imaging element layer are configured to receive red light, blue light, and green light, and
wherein the wiring lines are arranged in pixel regions configured to receive green light and blue light and wiring lines are not arranged in pixel regions configured to receive red light.

(5) The solid-state imaging device according to any one of (1) to (3), wherein the plurality of imaging elements located within the imaging element layer are configured to receive red light, blue light, and green light, and
wherein the wiring lines are arranged in pixel regions configured to receive blue light and wiring lines are not arranged in pixel regions configured to receive green light and red light.

(6) The solid-state imaging device according to any one of (1) to (3), wherein the plurality of imaging elements located within the imaging element layer are configured to receive white light, blue light, green light, and red light, and
wherein the wiring lines are arranged in pixel regions configured to receive blue light and wiring lines are not arranged in pixel regions configured to receive green light, red light, and white light.

(7) The solid-state imaging device according to any one of (1) to (6), wherein the wiring layers are located in an upper most layer of the wiring layer.

(8) The solid-state imaging device according to any one of (1) to (7), wherein the wiring lines of the upper most layer of the wiring layer arranged in pixel regions configured to receive light have a width that is small than a width of a pixel of the imaging element layer.

(9) The solid-state imaging device according to any one of (1) to (8), wherein the wiring lines of the upper most layer of the wiring layer are distributed within the wiring layer such that a wiring density is substantially equal.

(10) The solid-state imaging device according to any one of (1) to (9), further including a polishing layer located above the wiring layer, wherein the polishing layer is substantially flat.

(11) The solid-state imaging device according to any one of (1) to (10), wherein the imaging device is a back illuminated sensor.

(12) An electronic apparatus comprising a solid-state imaging device, the solid state imaging device including:
 a substrate; and
 an imaging element layer having a plurality of imaging elements, the imaging element layer located between the substrate and a wiring layer having a plurality of wiring lines, wherein wiring lines of the wiring layer are arranged in pixel regions configured to receive light having a wavelength less than a predetermined wavelength.

(13) The solid-state imaging device according to (12), wherein the wiring lines of the wiring layer are not arranged in pixel regions configured to receive light having a wavelength greater than the predetermined wavelength.

(14) The electronic apparatus according to (12) or (13), wherein the wiring lines of the wiring layer arranged in pixel regions configured to receive light are located below one or more imaging elements configured to receive light having a wavelength less than the predetermined wavelength.

(15) The electronic apparatus according to any one of (12) to (14), wherein the plurality of imaging elements located within the imaging element layer are configured to receive red light, blue light, and green light, and
 wherein the wiring lines are arranged in pixel regions configured to receive green light and blue light and wiring lines are not arranged in pixel regions configured to receive red light.

(16) The electronic apparatus according to any one of (12) to (14), wherein the plurality of imaging elements located within the imaging element layer are configured to receive red light, blue light, and green light, and
 wherein the wiring lines are arranged in pixel regions configured to receive blue light and wiring lines are not arranged in pixel regions configured to receive green light and red light.

(17) The electronic apparatus according to any one of (12) to (14), wherein the plurality of imaging elements located within the imaging element layer are configured to receive red light, blue light, green light, and red light, and
 wherein the wiring lines are arranged in pixel regions configured to receive blue light and wiring lines are not arranged in pixel regions configured to receive green light, red light, and white light.

(18) The electronic apparatus according to any one of (12) to (17), wherein the wiring layers are located in an upper most layer of the wiring layer.

(19) A method of manufacturing a solid-state imaging device, the method comprising: forming an imaging element layer between a substrate and a wiring layer; and
 forming one or more wiring lines at an upper layer of the wiring layer, wherein wiring lines of the wiring layer are arranged in pixel regions configured to receive light having a wavelength less than a predetermined wavelength and wiring lines of the wiring layer are not arranged in pixel regions configured to receive light having a wavelength greater than the predetermined wavelength.

(20) The method of manufacturing according to (19), further including: polishing a polishing film located between the wiring layer and a support substrate.

(21) A back surface radiation type image sensor that has dummy wiring lines adjusting a wiring density in an uppermost layer of a pixel region,
 wherein the dummy wiring lines are arranged in the pixel region in which light of a wavelength shorter than a predetermined wavelength is received.

(22) The back surface radiation type image sensor according to (21), wherein the dummy wiring lines are arranged in a pixel region in which light of a color of a wavelength shorter than the predetermined wavelength is received.

(23) The back surface radiation type image sensor according to (22), wherein the dummy wiring lines are arranged in a pixel region in which blue light is received.

(24) The back surface radiation type image sensor according to (23), wherein the dummy wiring lines are arranged in a pixel region in which green light is received.

(25) The back surface radiation type image sensor according to (24), wherein the back surface radiation type image sensor includes a pixel region in which blue light, green light, and red light are received.

(26) The back surface radiation type image sensor according to (25), wherein the back surface radiation type image sensor further includes a pixel region in which at least one of white light and infrared light is received.

(27) The back surface radiation type image sensor according to (21), wherein the predetermined wavelength is any wavelength of 400 to 600 nm.

(28) The back surface radiation type image sensor according to (27), wherein the dummy wiring lines are arranged in a pixel region in which light of a color with any wavelength of 400 to 600 nm as a peak and light of a color of a wavelength shorter than the wavelength of the color are received.

(29) The back surface radiation type image sensor according to (27), wherein the predetermined wavelength is any wavelength of 530 to 550 nm.

(30) The back surface radiation type image sensor according to (29), wherein the dummy wiring lines are arranged in a pixel region in which light of a color with any wavelength of 530 to 550 nm as a peak and light of a color of a wavelength shorter than the wavelength of the color are received.

(31) The back surface radiation type image sensor according to (21), wherein the dummy wiring lines are arranged in a pixel region in which light of a color of a wavelength shorter than a wavelength of a color with any wavelength of 630 to 650 nm as a peak is received.

(32) The back surface radiation type image sensor according to (31), wherein the dummy wiring lines have a pixel width or a width smaller than the pixel width.

(33) An imaging device including a back surface radiation type image sensor that has dummy wiring lines adjusting a wiring density in an uppermost layer of a pixel region, wherein the dummy wiring lines are arranged in the pixel region in which light of a wavelength shorter than a predetermined wavelength is received.

(34) An electronic apparatus including a back surface radiation type image sensor that has dummy wiring lines adjusting a wiring density in an uppermost layer of a pixel region,
 wherein the dummy wiring lines are arranged in the pixel region in which light of a wavelength shorter than a predetermined wavelength is received.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

11 Back surface radiation type image sensor
21 Wiring layer
21a Polishing film
22 Imaging element layer
23 Substrate
24 Support substrate
31 Wiring line
41, 41' Dummy wiring lines
70 Camera apparatus
72 Solid-state imaging device

What is claimed is:

1. A solid-state imaging device comprising:
a substrate; and
an imaging element layer having a plurality of imaging elements, the imaging element layer located between the substrate and a wiring layer having a plurality of wiring lines, wherein the wiring lines include necessary wiring lines and dummy wiring lines, wherein the dummy wiring lines of the wiring layer are arranged adjacent a center of pixel regions configured to receive light having a wavelength less than a predetermined wavelength, wherein the dummy wiring lines of the wiring layer are not arranged in pixel regions configured to receive light having a wavelength greater than the predetermined wavelength, and wherein the dummy wiring lines of the wiring layer are uniformly distributed throughout the wiring layer.

2. The solid-state imaging device according to claim 1, wherein the plurality of imaging elements located within the imaging element layer are configured to receive red light, blue light, and green light, wherein the dummy wiring lines are arranged adjacent a center of pixel regions configured to receive green light and blue light, and wherein the dummy wiring lines are not arranged in pixel regions configured to receive red light.

3. The solid-state imaging device according to claim 1, wherein the plurality of imaging elements located within the imaging element layer are configured to receive red light, blue light, and green light, and wherein the dummy wiring lines are arranged adjacent a center of pixel regions configured to receive blue light, and wherein the dummy wiring lines are not arranged in pixel regions configured to receive green light and red light.

4. The solid-state imaging device according to claim 1, wherein the plurality of imaging elements located within the imaging element layer are configured to receive red light, blue light, green light, and white light, wherein the dummy wiring lines are arranged adjacent a center of pixel regions configured to receive blue light, and wherein the dummy wiring lines are not arranged in pixel regions configured to receive green light, red light, and white light.

5. The solid-state imaging device according to claim 1, wherein the dummy wiring lines are located in an upper most layer of the wiring layer.

6. The solid-state imaging device according to claim 5, wherein the dummy wiring lines of the upper most layer of the wiring layer arranged in pixel regions configured to receive light have a width that is smaller than a width of a pixel of the imaging element layer.

7. The solid-state imaging device according to claim 5, wherein the dummy wiring lines of the upper most layer of the wiring layer are distributed within the wiring layer such that a wiring density is substantially equal.

8. The solid-state imaging device according to claim 7, further including a polishing layer located above the wiring layer, wherein the polishing layer is substantially flat.

9. The solid-state imaging device according to claim 1, wherein the imaging device is a back illuminated sensor.

10. An electronic apparatus comprising a solid-state imaging device, the solid state imaging device including:
a substrate; and
an imaging element layer having a plurality of imaging elements, the imaging element layer located between the substrate and a wiring layer having a plurality of wiring lines, wherein the wiring lines include necessary wiring lines and dummy wiring lines, wherein the dummy wiring lines of the wiring layer are arranged adjacent a center of pixel regions configured to receive light having a wavelength less than a predetermined wavelength, wherein the dummy wiring lines of the wiring layer are not arranged in pixel regions configured to receive light having a wavelength greater than the predetermined wavelength, and wherein the dummy wiring lines of the wiring layer are uniformly distributed throughout the wiring layer.

11. The electronic apparatus according to claim 10, wherein the plurality of imaging elements located within the imaging element layer are configured to receive red light, blue light, and green light, and wherein the dummy wiring lines are arranged adjacent a center of pixel regions configured to receive green light and blue light, and wherein wiring lines are not arranged in pixel regions configured to receive red light.

12. The electronic apparatus according to claim 10, wherein the plurality of imaging elements located within the imaging element layer are configured to receive red light, blue light, and green light, and wherein the dummy wiring lines are arranged adjacent a center of pixel regions configured to receive blue light, and wherein the dummy wiring lines are not arranged in pixel regions configured to receive green light and red light.

13. The electronic apparatus according to claim 10, wherein the plurality of imaging elements located within the imaging element layer are configured to receive red light, blue light, green light, and red light, and wherein the dummy wiring lines are arranged adjacent a center of pixel regions configured to receive blue light, and wherein the dummy wiring lines are not arranged in pixel regions configured to receive green light, red light, and white light.

14. The electronic apparatus according to claim 10, wherein the wiring layers are located in an upper most layer of the wiring layer.

15. A method of manufacturing a solid-state imaging device, the method comprising:
forming an imaging element layer between a substrate and a wiring layer; and
forming one or more wiring lines at an upper layer of the wiring layer, wherein the wiring lines include necessary wiring lines and dummy wiring lines, wherein the dummy wiring lines of the wiring layer are arranged in pixel regions configured to receive light having a wavelength less than a predetermined wavelength, and wherein the dummy wiring lines of the wiring layer are not arranged in pixel regions configured to receive light having a wavelength greater than the predetermined wavelength.

16. The method of manufacturing according to claim 15, further including:
polishing a polishing film located between the wiring layer and a support substrate.

* * * * *